(12) United States Patent
Liang et al.

(10) Patent No.: US 10,840,383 B1
(45) Date of Patent: Nov. 17, 2020

(54) NON-VOLATILE MEMORY (NVM) STRUCTURE WITH FRONT AND BACK GATES

(71) Applicant: QUALCOMM Incorporated, San Diego, CA (US)

(72) Inventors: Qingqing Liang, San Diego, CA (US); Peter Graeme Clarke, San Diego, CA (US); George Pete Imthurn, San Diego, CA (US); Sinan Goktepeli, San Diego, CA (US); Sivakumar Kumarasamy, San Diego, CA (US)

(73) Assignee: Qualcomm Incorporated, San Diego, CA (US)

( * ) Notice: Subject to any disclaimer, the term of this patent is extended or adjusted under 35 U.S.C. 154(b) by 0 days.

(21) Appl. No.: 16/415,175

(22) Filed: May 17, 2019

(51) Int. Cl.
| | |
|---|---|
| *H01L 29/788* | (2006.01) |
| *H01L 29/423* | (2006.01) |
| *G11C 16/10* | (2006.01) |
| *H01L 29/66* | (2006.01) |
| *G11C 16/04* | (2006.01) |
| *H01L 21/28* | (2006.01) |

(52) U.S. Cl.
CPC ...... *H01L 29/7887* (2013.01); *G11C 16/0408* (2013.01); *G11C 16/10* (2013.01); *H01L 29/40114* (2019.08); *H01L 29/42324* (2013.01); *H01L 29/66825* (2013.01)

(58) Field of Classification Search
CPC .......... H01L 29/7887; H01L 29/40114; H01L 29/66825; H01L 29/42324; H01L 29/42328; H01L 29/7883; G11C 16/0408; G11C 16/10
See application file for complete search history.

(56) References Cited

U.S. PATENT DOCUMENTS 9,444,041 B2 * 9/2016 Lim ................. H01L 29/66833
2018/0175209 A1 * 6/2018 Faul ................. H01L 29/42328

* cited by examiner

*Primary Examiner* — David Lam
(74) *Attorney, Agent, or Firm* — Patterson & Sheridan, L.L.P.

(57) ABSTRACT

Certain aspects of the present disclosure are directed to a memory cell implemented using front and back gate regions. One example memory cell generally includes a first semiconductor region, a second semiconductor region, and a third semiconductor region, the second semiconductor region being disposed between the first semiconductor region and the third semiconductor region. The memory cell may also include a front gate region disposed above the second semiconductor region, a floating back gate region, a first portion of the floating back gate region being disposed below the second semiconductor region, and a non-insulative region disposed adjacent to the floating back gate region.

20 Claims, 7 Drawing Sheets

NON-VOLATILE MEMORY (NVM) STRUCTURE WITH FRONT AND BACK GATES

FIELD OF THE DISCLOSURE

The teachings of the present disclosure relate generally to a memory cell, and more particularly, to a memory cell implemented with front and back gates.

DESCRIPTION OF RELATED ART

Electronic devices including processors and memory are used extensively today in almost every electronic application. The processor controls the execution of program instructions, arithmetic functions, and access to memory and peripherals. In the simplest form, the processor executes program instructions by performing one or more arithmetic functions on data stored in memory.

SUMMARY

The following presents a simplified summary of one or more aspects of the present disclosure, in order to provide a basic understanding of such aspects. This summary is not an extensive overview of all contemplated features of the disclosure, and is intended neither to identify key or critical elements of all aspects of the disclosure nor to delineate the scope of any or all aspects of the disclosure. Its sole purpose is to present some concepts of one or more aspects of the disclosure in a simplified form as a prelude to the more detailed description that is presented later.

Certain aspects of the present disclosure are generally directed to a memory cell implemented using front and back gates.

Certain aspects are directed to a memory cell, in accordance with certain aspects of the present disclosure. The memory cell generally includes a first semiconductor region, a second semiconductor region, a third semiconductor region, the second semiconductor region being disposed between the first semiconductor region and the third semiconductor region, a front gate region disposed above the second semiconductor region, a floating back gate region, a first portion of the floating back gate region being disposed below the second semiconductor region, and a non-insulative region disposed adjacent to the floating back gate region and coupled to a word line of the memory cell.

Certain aspects are directed to a method for programming a memory cell. The method generally includes determine a logic state to be stored in the memory cell, generating a voltage signal based on the determination of the logic state to be stored in the memory cell, and applying the voltage signal to a non-insulative region of the memory cell to transfer charge to a floating back gate region of the memory cell.

Certain aspects are directed to a method for fabricating a memory cell. The method generally includes forming a first semiconductor region, a second semiconductor region, and a third semiconductor region, the second semiconductor region being between the first semiconductor region and the third semiconductor region; forming a front gate region above the second semiconductor region; forming a floating back gate region, a first portion of the floating back gate region being below the second semiconductor region; and forming a non-insulative region adjacent to the floating back gate region, the non-insulative region being coupled to a word line of the memory cell.

BRIEF DESCRIPTION OF THE DRAWINGS

So that the manner in which the above-recited features of the present disclosure can be understood in detail, a more particular description, briefly summarized above, may be had by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects.

DETAILED DESCRIPTION

Figure 1:
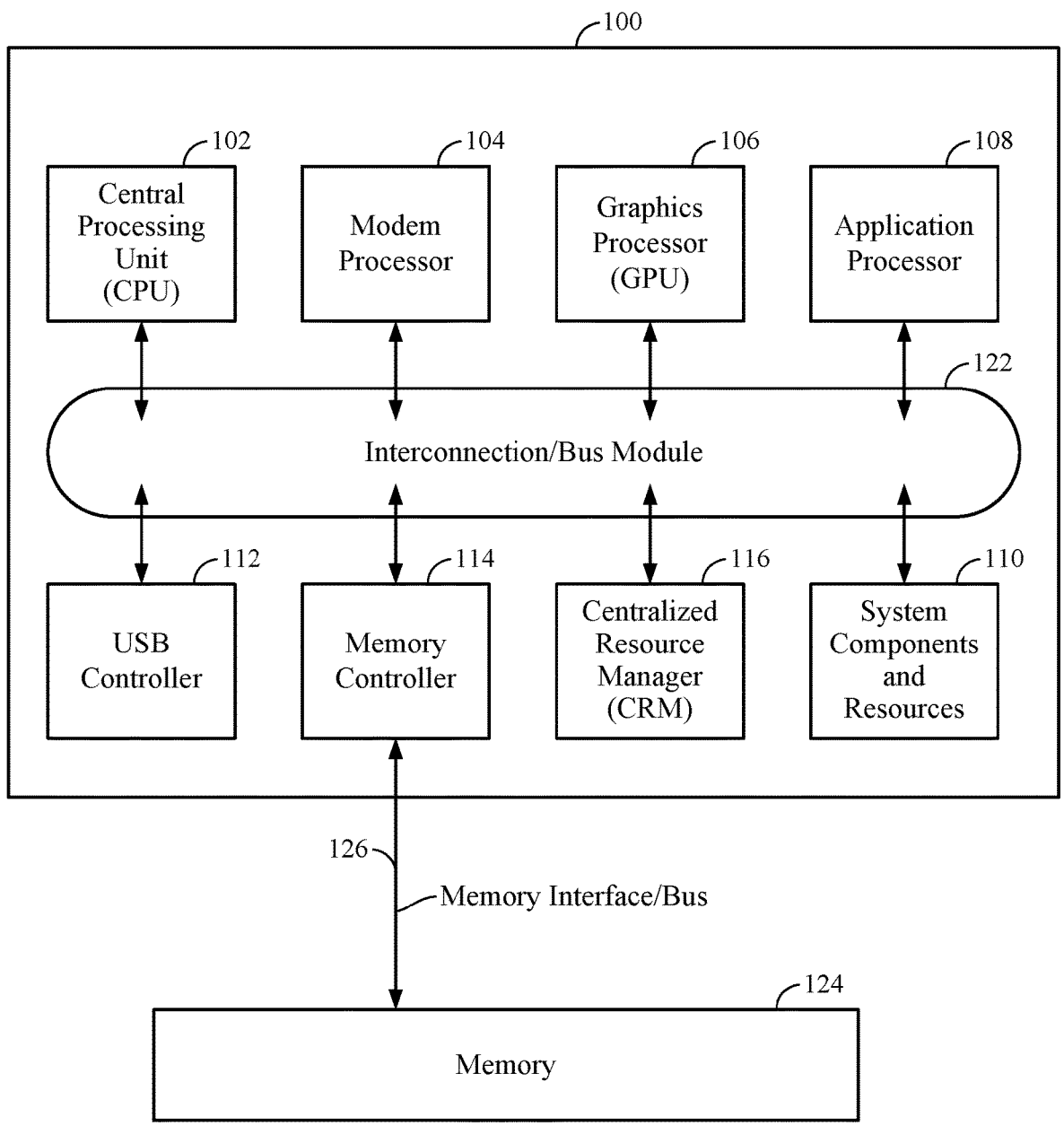
FIG. 1 is an illustration of an exemplary system-on-chip (SoC) integrated circuit design, in accordance with certain aspects of the present disclosure.

Certain aspects of the present disclosure are generally directed to a non-volatile memory (NVM) implemented using field-effect transistors (FETs) having front and back gates. The back gate of each FET may be a floating gate used to store charge, adjusting the threshold voltage of the FET to indicate a logic state. Using the back gate to store charge results in a greater variation of the threshold voltage of the FET, as compared to conventional implementations, allowing the logic state to be more easily detected during a read operation of the NVM.

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well-known structures and components are shown in block diagram form in order to avoid obscuring such concepts.

The various aspects will be described in detail with reference to the accompanying drawings. Wherever possible, the same reference numbers will be used throughout the drawings to refer to the same or like parts. References made to particular examples and implementations are for illustrative purposes, and are not intended to limit the scope of the disclosure or the claims.

The terms "computing device" and "mobile device" are used interchangeably herein to refer to any one or all of servers, personal computers, smartphones, cellular telephones, tablet computers, laptop computers, netbooks, ultrabooks, palm-top computers, personal data assistants (PDAs), wireless electronic mail receivers, multimedia Internet-enabled cellular telephones, Global Positioning System (GPS) receivers, wireless gaming controllers, and similar personal electronic devices which include a programmable processor. While the various aspects are particularly useful in mobile devices (e.g., smartphones, laptop computers, etc.), which have limited resources (e.g., processing power, battery, size, etc.), the aspects are generally useful in any computing device that may benefit from improved processor performance and reduced energy consumption.

The term "multicore processor" is used herein to refer to a single integrated circuit (IC) chip or chip package that contains two or more independent processing units or cores (e.g., CPU cores, etc.) configured to read and execute program instructions. The term "multiprocessor" is used herein to refer to a system or device that includes two or more processing units configured to read and execute program instructions.

The term "system on chip" (SoC) is used herein to refer to a single integrated circuit (IC) chip that contains multiple resources and/or processors integrated on a single substrate. A single SoC may contain circuitry for digital, analog, mixed-signal, and radio-frequency functions. A single SoC may also include any number of general purpose and/or specialized processors (digital signal processors (DSPs), modem processors, video processors, etc.), memory blocks, and resources (e.g., timers, voltage regulators, oscillators, etc.), any or all of which may be included in one or more cores.

A number of different types of memories and memory technologies are available or contemplated in the future, all of which are suitable for use with the various aspects of the present disclosure. Such memory technologies/types include dynamic random-access memory (DRAM), static random-access memory (SRAM), non-volatile random-access memory (NVRAM), flash memory (e.g., embedded multimedia card (eMMC) flash), pseudostatic random-access memory (PSRAM), double data rate synchronous dynamic random-access memory (DDR SDRAM), and other random-access memory (RAM) and read-only memory (ROM) technologies known in the art. A DDR SDRAM memory may be a DDR type 1 SDRAM memory, DDR type 2 SDRAM memory, DDR type 3 SDRAM memory, or a DDR type 4 SDRAM memory. Each of the above-mentioned memory technologies includes, for example, elements suitable for storing instructions, programs, control signals, and/or data for use in or by a computer or other digital electronic device. Any references to terminology and/or technical details related to an individual type of memory, interface, standard, or memory technology are for illustrative purposes only, and not intended to limit the scope of the claims to a particular memory system or technology unless specifically recited in the claim language. Mobile computing device architectures have grown in complexity, and now commonly include multiple processor cores, SoCs, co-processors, functional modules including dedicated processors (e.g., communication modem chips, GPS receivers, etc.), complex memory systems, intricate electrical interconnections (e.g., buses and/or fabrics), and numerous other resources that execute complex and power intensive software applications (e.g., video streaming applications, etc.).

FIG. 1 illustrates example components and interconnections in a system-on-chip (SoC) 100 suitable for implementing various aspects of the present disclosure. The SoC 100 may include a number of heterogeneous processors, such as a central processing unit (CPU) 102, a modem processor 104, a graphics processor 106, and an application processor 108. Each processor 102, 104, 106, 108, may include one or more cores, and each processor/core may perform operations independent of the other processors/cores. The processors 102, 104, 106, 108 may be organized in close proximity to one another (e.g., on a single substrate, die, integrated chip, etc.) so that the processors may operate at a much higher frequency/clock rate than would be possible if the signals were to travel off-chip. The proximity of the cores may also allow for the sharing of on-chip memory and resources (e.g., voltage rails), as well as for more coordinated cooperation between cores.

The SoC 100 may include system components and resources 110 for managing sensor data, analog-to-digital conversions, and/or wireless data transmissions, and for performing other specialized operations (e.g., decoding high-definition video, video processing, etc.). System components and resources 110 may also include components such as voltage regulators, oscillators, phase-locked loops (PLLs), peripheral bridges, data controllers, system controllers, access ports, timers, and/or other similar components used to support the processors and software clients running on the computing device. The system components and resources 110 may also include circuitry for interfacing with peripheral devices, such as cameras, electronic displays, wireless communication devices, external memory chips, etc.

The SoC 100 may further include a Universal Serial Bus (USB) controller 112, one or more memory controllers 114, and a centralized resource manager (CRM) 116. The SoC 100 may also include an input/output module (not illustrated) for communicating with resources external to the SoC, each of which may be shared by two or more of the internal SoC components.

The processors 102, 104, 106, 108 may be interconnected to the USB controller 112, the memory controller 114, system components and resources 110, CRM 116, and/or other system components via an interconnection/bus module 122, which may include an array of reconfigurable logic gates and/or implement a bus architecture. Communications may also be provided by advanced interconnects, such as high performance networks on chip.

The interconnection/bus module 122 may include or provide a bus mastering system configured to grant SoC components (e.g., processors, peripherals, etc.) exclusive control of the bus (e.g., to transfer data in burst mode, block transfer mode, etc.) for a set duration, number of operations, number of bytes, etc. In some cases, the interconnection/bus module 122 may implement an arbitration scheme to prevent multiple master components from attempting to drive the bus simultaneously.

The memory controller 114 may be a specialized hardware module configured to manage the flow of data to and from a memory 124 via a memory interface/bus 126. In certain aspects, the memory 124 may be a non-volatile memory (NVM) implemented using front and back gates, as described in more detail herein.

The memory controller 114 may comprise one or more processors configured to perform read and write operations with the memory 124. Examples of processors include microprocessors, microcontrollers, digital signal processors (DSPs), field programmable gate arrays (FPGAs), programmable logic devices (PLDs), state machines, gated logic, discrete hardware circuits, and other suitable hardware configured to perform the various functionality described throughout this disclosure. In certain aspects, the memory 124 may be part of the SoC 100.

Example Non-Volatile Memory (NVM) Structure

Non-volatile memory (NVM) (e.g., flash memory) is currently in high demand. A NVM cell may be implemented via a transistor having a floating gate that may be charged to adjust the threshold voltage of the transistor indicating a logic state. Integrating a NVM cell using a complementary metal-oxide semiconductor (CMOS) technology may be complex, and often takes up a large area. A floating region (e.g., floating gate) of an NVM cell generally refers to a region that is electrically isolated from other regions of the NVM cell. Certain aspects of the present disclosure are generally directed to a NVM structure implemented using layer transfer technology to implement front and back gates for the NVM structure. The NVM structure described herein achieves both a reduction in density and an increase in speed, as compared to conventional flash memory types.

Figure 2:
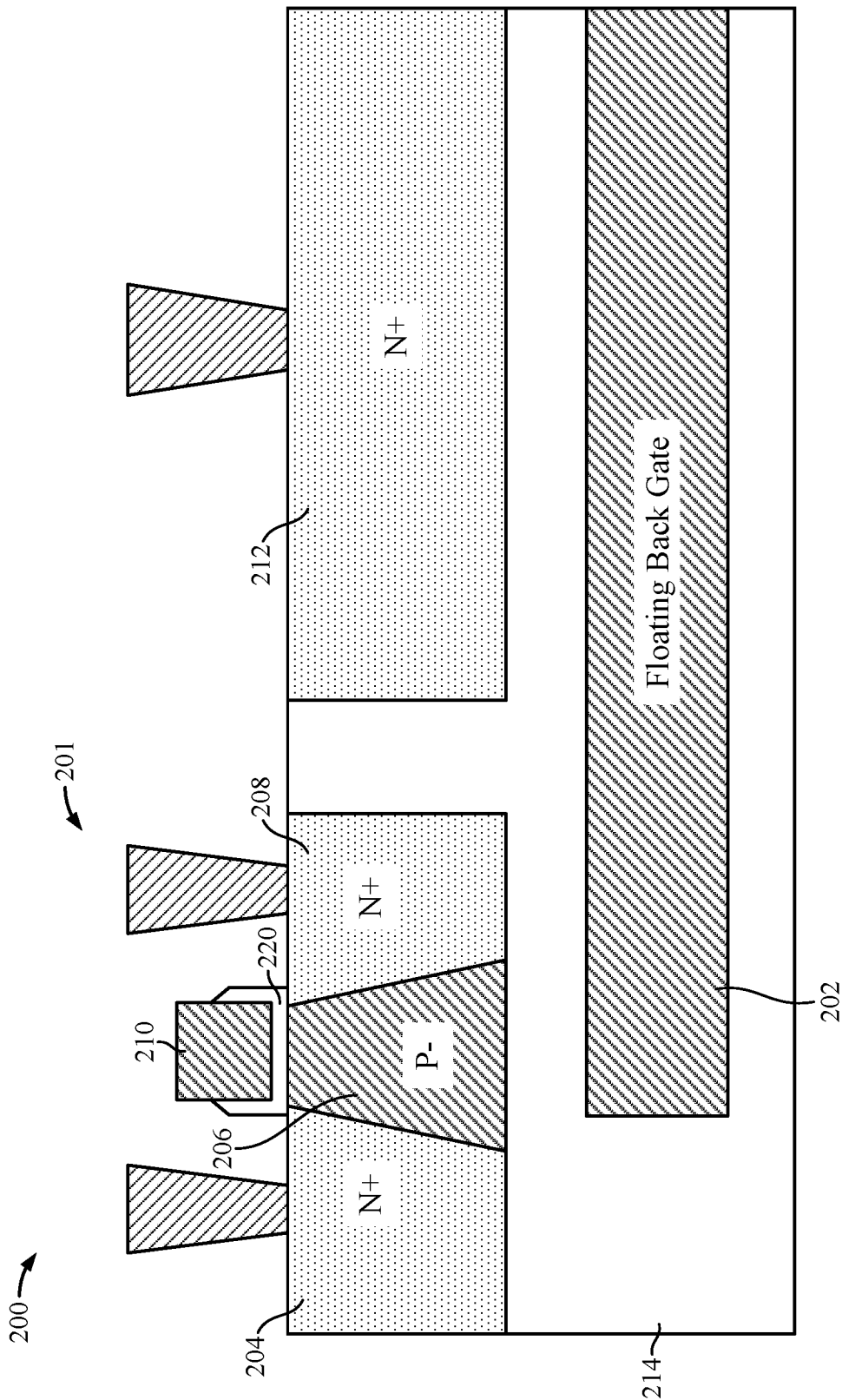
FIG. 2 illustrates an example non-volatile memory (NVM) cell, in accordance with certain aspects of the present disclosure.

FIG. 2 is a cross-sectional view of an example NVM cell 200, in accordance with certain aspects of the present disclosure. The NVM cell 200 includes semiconductor regions 204, 206, 208. As illustrated, the semiconductor region 206 is disposed between and has an opposite doping type than the semiconductor regions 204, 208, creating a channel between the semiconductor regions 204, 208. For example, the semiconductor region 206 may have a positive doping concentration, while the semiconductor regions 204, 208 have negative doping concentrations.

A front gate region 210 may be disposed above the semiconductor region 206 to form a field-effect transistor (FET) 201 (e.g., an n-type FET). For example, a dielectric layer 220 may be disposed between the front gate region 210 and the semiconductor region 206, as illustrated.

In certain aspects, a non-insulative region 212 may be disposed adjacent to the FET 201, as illustrated. As used herein, a non-insulative region generally refers to a region that may be semiconductive or conductive (e.g., metal). The non-insulative region 212 may be coupled to a word line of the memory 124 to enable a write operation of the NVM cell 200. The non-insulative region 212 may be a semiconductor having the same doping type as the semiconductor regions 204, 208. A floating back gate region 202 may be disposed below the semiconductor region 206 and the non-insulative region 212, as illustrated. For example, the floating back gate region 202 may span from below the semiconductor region 206 to below the non-insulative region 212, allowing the floating back gate region 202 to be charged via the non-insulative region 212 to adjust the threshold voltage of the FET 201. As illustrated, the floating back gate region is electrically isolated via a dielectric region 214.

Figure 3:
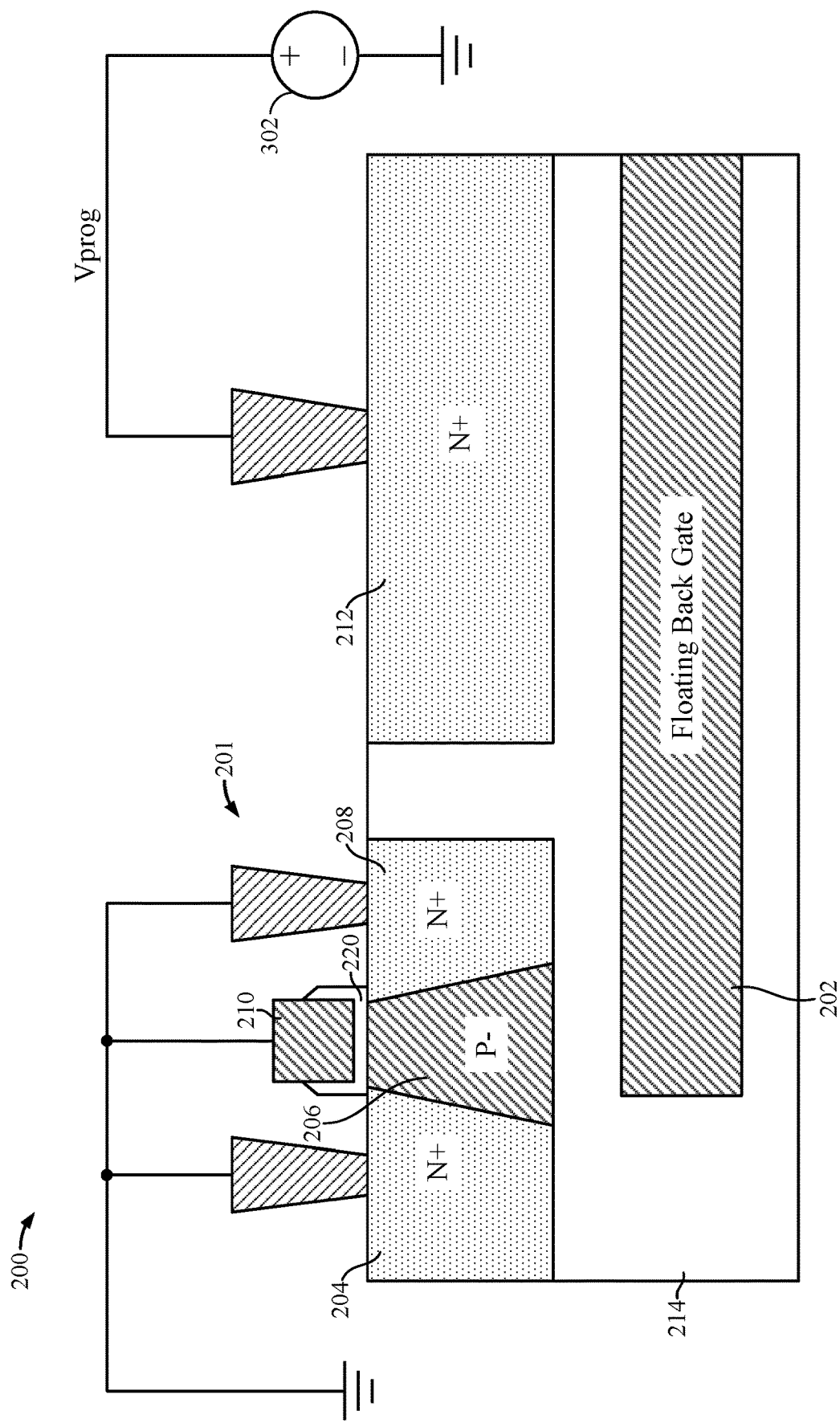
FIG. 3 illustrates an example write operation for the NVM cell of FIG. 2, in accordance with certain aspects of the present disclosure.

FIG. 3 illustrates an example write operation for the NVM cell 200, in accordance with certain aspects of the present disclosure. As illustrated, a voltage source 302 may be used to apply a voltage signal (e.g., a programming voltage (Vprog)) to the non-insulative region 212, while a reference potential (e.g., electric ground) is applied to the semiconductor regions 204, 208 and the front gate region 210.

The voltage source 302 may be configured to apply a positive voltage signal to store charge in the floating back gate region 202, adjusting the threshold voltage of the FET 201 to indicate a logic state (e.g., logic high). In certain aspects, the voltage source 302 may be configured to apply a negative voltage signal to discharge the floating back gate region 202, indicating another logic state (e.g., logic low).

During a read operation, a voltage source may be used to apply a voltage signal to the semiconductor region 204 and the front gate region 210, while a reference potential (e.g., electric ground) is applied to the semiconductor region 208. A current flowing from the voltage source to the semiconductor region 204 may be detected to determine the logic state of the NVM cell 200 since the detected current will depend on the threshold voltage of the FET 201 which is adjusted based on the charge stored in the floating back gate region 202, as described herein. Using a floating back gate region to store charge results in a larger variation of the threshold voltage of the FET, as compared to conventional implementations, and this larger varying voltage can be more easily detected during the read operation.

Figure 4:
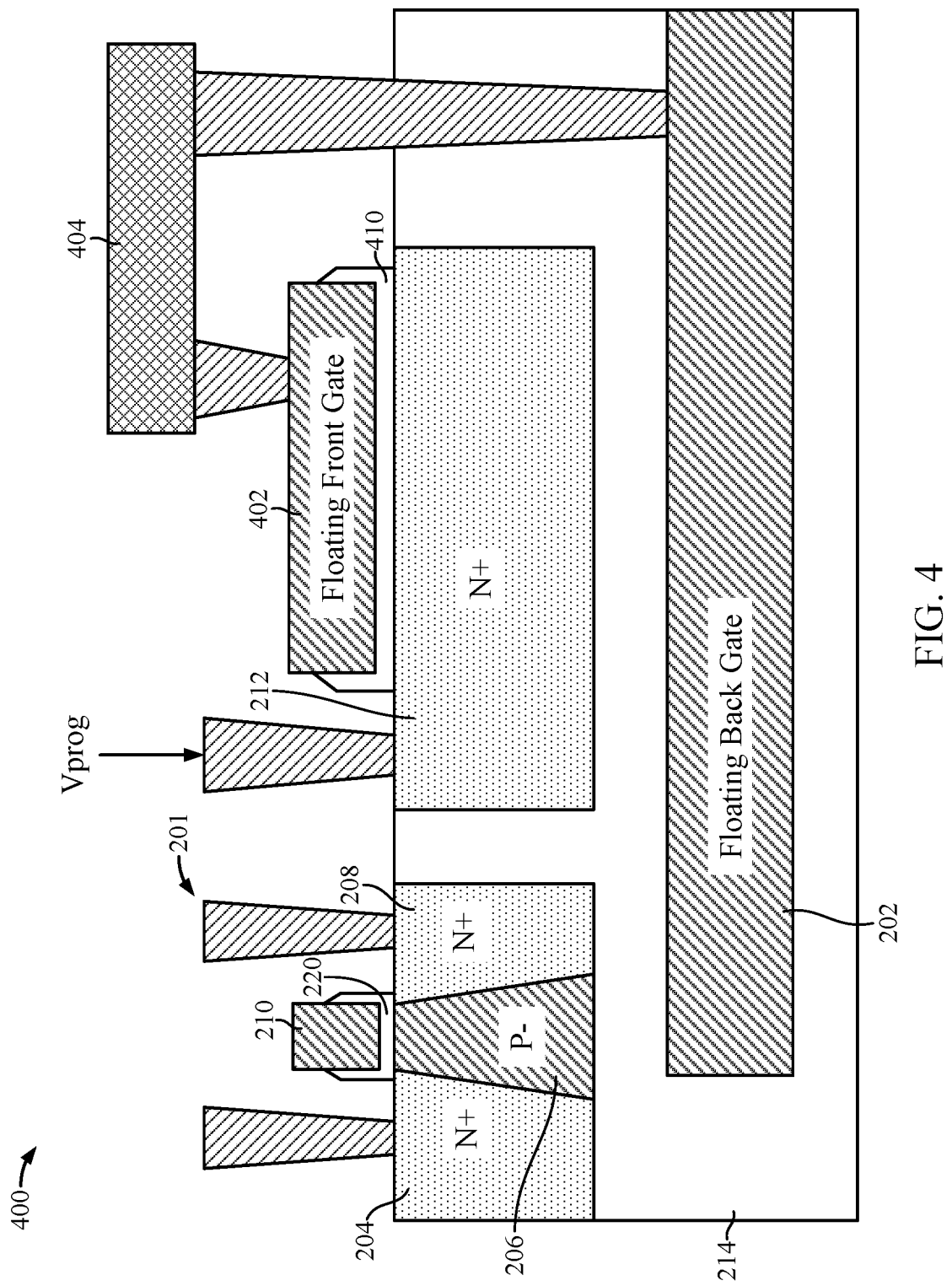
FIG. 4 illustrates an example NVM cell implemented with front and back floating gates, in accordance with certain aspects of the present disclosure.

FIG. 4 is a cross-sectional view of an example NVM cell 400 implemented with front and back floating gates, in accordance with certain aspects of the present disclosure. As illustrated, a floating front gate region 402 (e.g., a floating non-insulative region) may be disposed above the non-insulative region 212. For example a dielectric layer 410 may be disposed between the non-insulative region 212 and the floating front gate region 402. The floating front gate region 402 may be shorted or otherwise coupled to the floating back gate region 202. For example, a non-insulative region 404 may be coupled between the floating front gate region 402 and the floating back gate region 202, as illustrated. The floating front gate region 402 allows for a reduction of the voltage used to program a logic state to the NVM cell 200. In other words, a voltage signal (Vprog) applied to the non-insulative region 212 of the NVM cell 400 more efficiently charges the floating back gate region 202 by charging the floating front gate region 402 that is shorted or otherwise coupled to the floating back gate.

Figure 5:
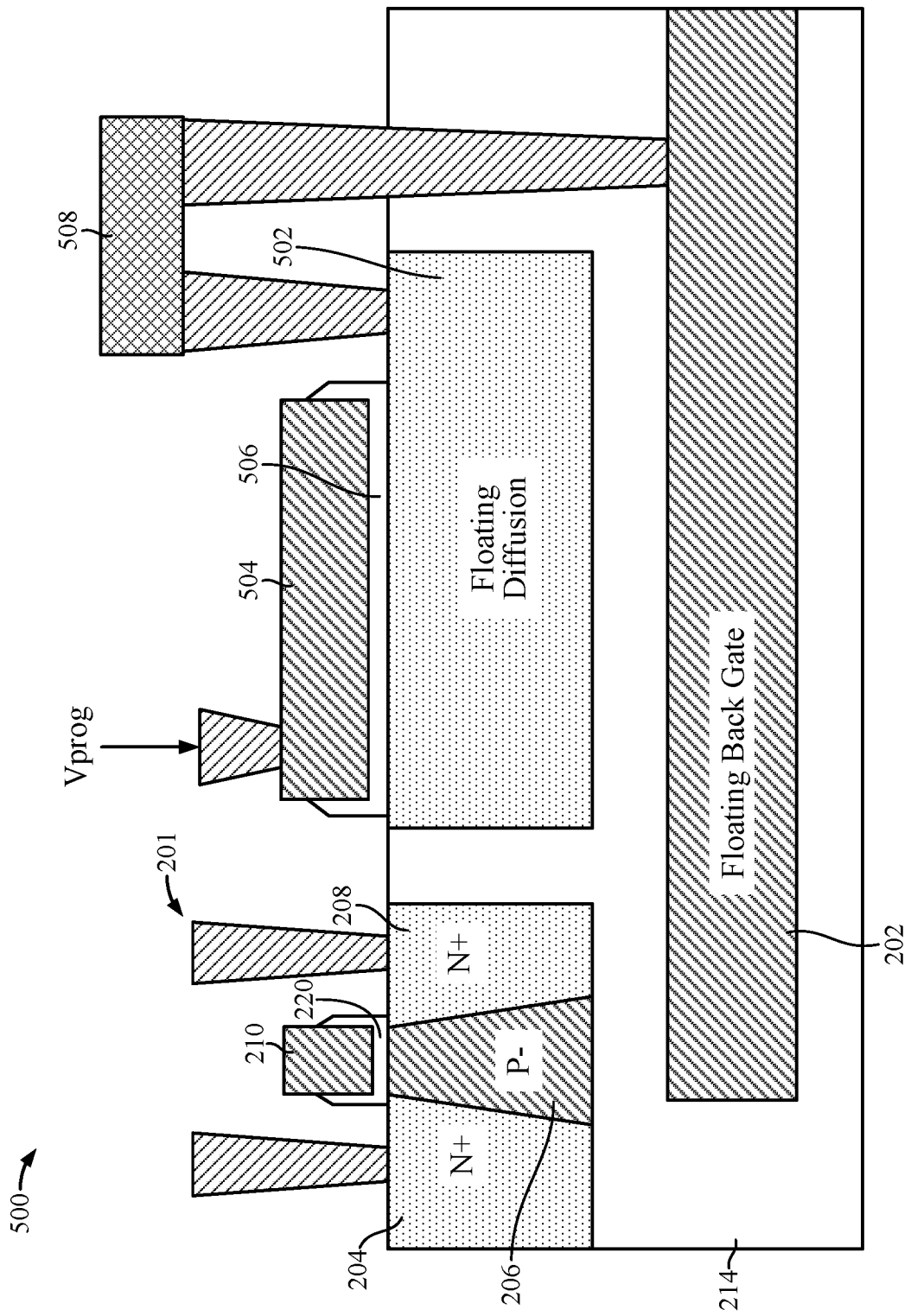
FIG. 5 illustrates an example NVM cell implemented with a floating diffusion region, in accordance with certain aspects of the present disclosure.

FIG. 5 is a cross-sectional view of an example NVM cell 500 implemented with a floating diffusion region 502 (e.g., also referred to herein as a "floating non-insulative region" or a "floating semiconductor region"), in accordance with certain aspects of the present disclosure. As illustrated, a front gate region 504 (e.g., a non-insulative region) may be disposed above the floating diffusion region 502. For example, a dielectric layer 506 may be disposed between the front gate region 504 and the floating diffusion region 502. The floating diffusion region 502 may be shorted or otherwise coupled to the floating back gate region 202. For example, a non-insulative region 508 may be coupled between the floating diffusion region 502 and the floating back gate region 202, as illustrated. The floating diffusion region 502 allows for a reduction of the voltage used to program a logic state of the NVM cell 500. In other words, a voltage signal (Vprog) may be applied to the front gate region 504, transferring charge to the floating diffusion region 502 and also charging the floating back gate region 202 since the floating back gate region 202 is shorted or otherwise coupled to the floating diffusion region 502.

Figure 6:
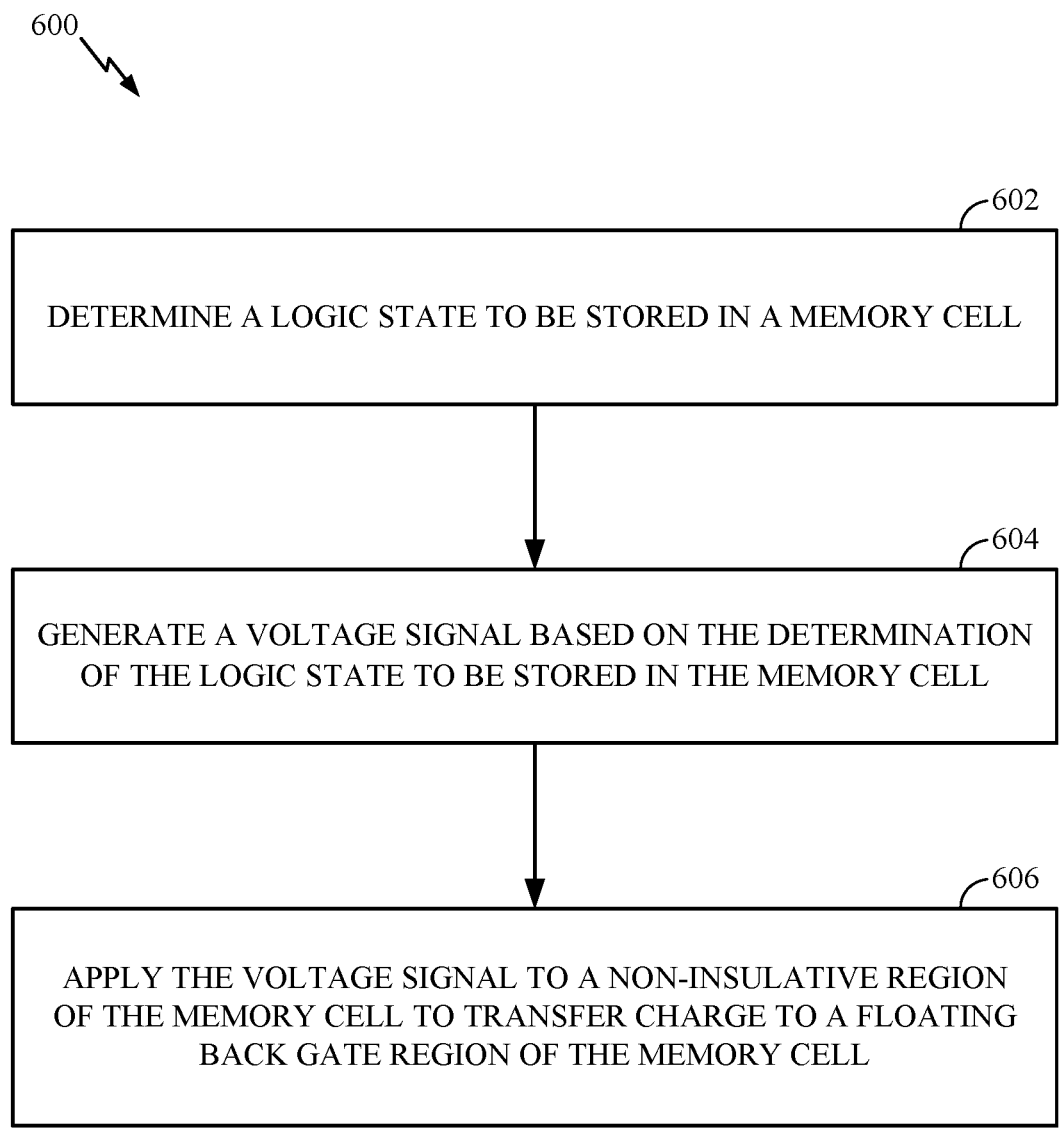
FIG. 6 is a flow diagram illustrating example operations for programming a memory cell, in accordance with certain aspects of the present disclosure.

FIG. 6 is a flow diagram illustrating example operations 600 for programming a memory cell, in accordance with certain aspects of the present disclosure. The operations 600 may be performed by a memory control system, such as the memory controller 114 and voltage source 302.

The operations 600 begin, at block 602, with the memory control system determining a logic state to be stored in the memory cell. At block 604, the memory control system may generate (e.g., via voltage source 302) a voltage signal based on the determination of the logic state to be stored in the memory cell, and at block 606, apply the voltage signal to a non-insulative region (e.g., non-insulative region 212) of the memory cell to transfer charge to a floating back gate region (e.g., floating back gate region 202) of the memory cell.

In certain aspects, the non-insulative region is above at least a portion of the floating back gate region. In certain aspects, the memory cell comprises a FET (e.g., FET 201). The FET may include a front gate region (e.g., front gate region 210), the floating back gate region and the front gate region being disposed adjacent to opposite sides of a semiconductor region (e.g., semiconductor region 206) of the FET.

In certain aspects, the charge is transferred to the floating back gate region via a floating non-insulative region (e.g., floating front gate region 402) shorted to the floating back gate region, the floating non-insulative region being disposed above the non-insulative region. In certain aspects, the charge is transferred to the floating back gate region via a floating semiconductor region (e.g., floating diffusion region 502) shorted to the floating back gate region, the non-insulative region (e.g., front gate region 504) being disposed above the floating semiconductor region.

Figure 7:
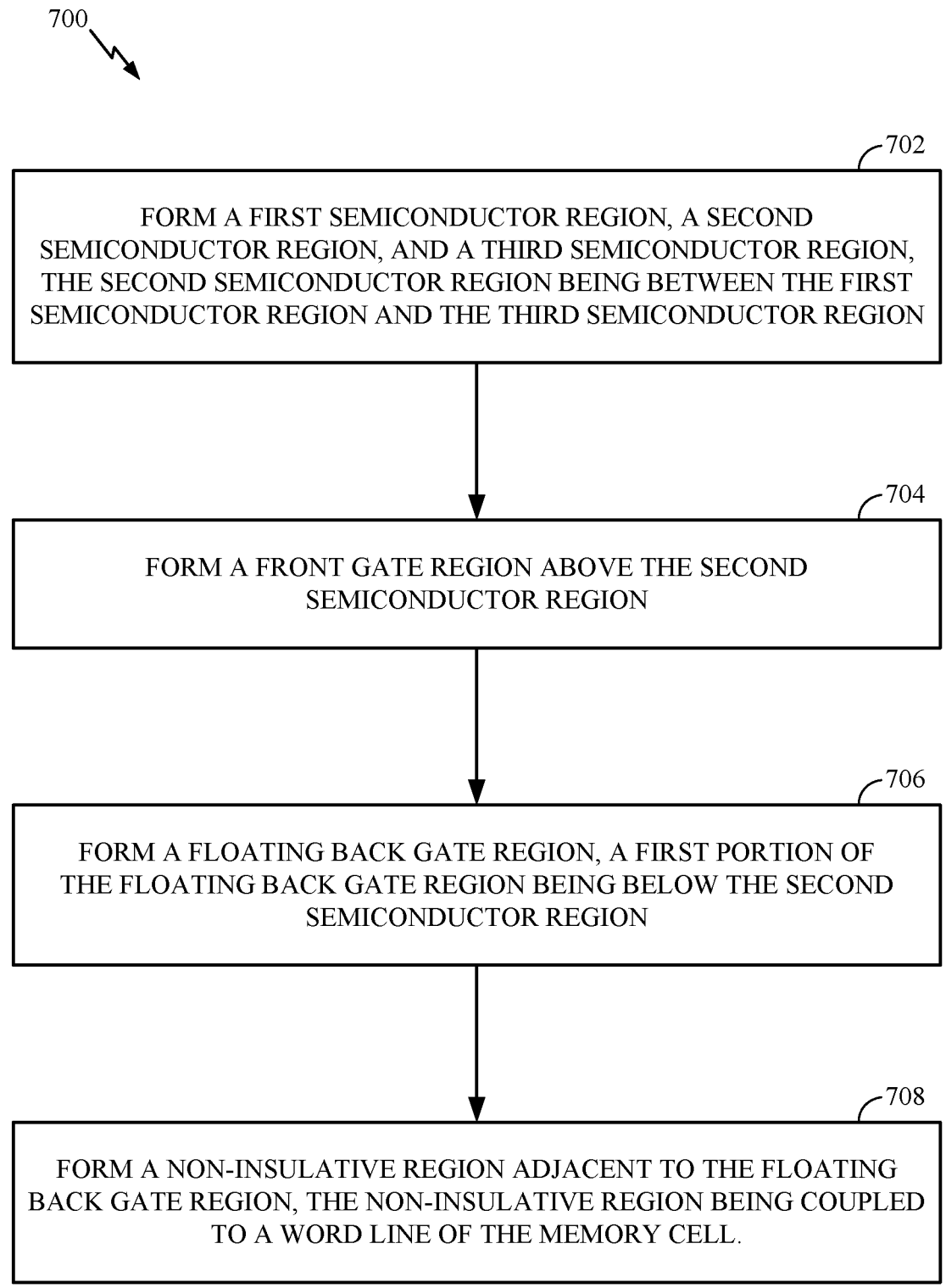
FIG. 7 is a flow diagram illustrating example operations for fabricating a memory cell, in accordance with certain aspects of the present disclosure.

FIG. 7 is a flow diagram illustrating example operations 700 for fabricating a memory cell, in accordance with certain aspects of the present disclosure. The operations 700 may be performed by semiconductor processing chamber.

The operations 700 begin, at block 702, with the semiconductor processing chamber forming a first semiconductor region (e.g., semiconductor region 204), a second semiconductor region (e.g., semiconductor region 206), and a third semiconductor region (e.g., semiconductor region 208, the second semiconductor region being between the first semiconductor region and the third semiconductor region. At block 704, the semiconductor processing chamber forms a front gate region (e.g., front gate region 210) above the second semiconductor region, and at block 706, forms a floating back gate region (e.g., floating back gate region 202), a first portion of the floating back gate region being below the second semiconductor region. At block 708, the semiconductor processing chamber forms a non-insulative region (e.g., non-insulative region 212) adjacent to the back gate region, the non-insulative region being coupled to a word line of the memory cell.

In certain aspects, the non-insulative region may be formed above a second portion of the floating back gate region. In certain aspects, the operations 700 also include the semiconductor processing chamber forming a dielectric layer (e.g., dielectric layer 220), the dielectric layer being between the front gate region and the second semiconductor region.

In certain aspects, the operations 700 also include the semiconductor processing chamber forming a floating non-insulative region (e.g., floating front gate region 402) above the non-insulative region, the floating non-insulative region being shorted to the floating back gate region. In certain aspects, the operations 700 also include the semiconductor processing chamber forming a dielectric layer (e.g., dielectric layer 410), the dielectric layer being between the non-insulative region and the floating non-insulative region.

In certain aspects, the non-insulative region comprises a floating semiconductor region (e.g., floating diffusion region 502). In this case, the operations 700 also include the semiconductor processing chamber shorting the floating back gate region to the floating semiconductor region, and forming another non-insulative region (e.g., front gate region 504) above the floating semiconductor region.

Within the present disclosure, the word "exemplary" is used to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage, or mode of operation. The term "coupled" is used herein to refer to the direct or indirect coupling between two objects. For example, if object A physically touches object B and object B touches object C, then objects A and C may still be considered coupled to one another—even if objects A and C do not directly physically touch each other. For instance, a first object may be coupled to a second object even though the first object is never directly physically in contact with the second object. The terms "circuit" and "circuitry" are used broadly and intended to include both hardware implementations of electrical devices and conductors that, when connected and configured, enable the performance of the functions described in the present disclosure, without limitation as to the type of electronic circuits.

The apparatus and methods described in the detailed description are illustrated in the accompanying drawings by various blocks, modules, components, circuits, steps, processes, algorithms, etc. (collectively referred to as "elements"). These elements may be implemented using hardware, for example.

One or more of the components, steps, features, and/or functions illustrated herein may be rearranged and/or combined into a single component, step, feature, or function or embodied in several components, steps, or functions. Additional elements, components, steps, and/or functions may also be added without departing from features disclosed herein. The apparatus, devices, and/or components illustrated herein may be configured to perform one or more of the methods, features, or steps described herein. The algorithms described herein may also be efficiently implemented in software and/or embedded in hardware.

It is to be understood that the specific order or hierarchy of steps in the methods disclosed is an illustration of exemplary processes. Based upon design preferences, it is understood that the specific order or hierarchy of steps in the methods may be rearranged. The accompanying method claims present elements of the various steps in a sample order, and are not meant to be limited to the specific order or hierarchy presented unless specifically recited therein.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language of the claims, wherein reference to an element in the singular is not intended to mean "one and only one" unless specifically so stated, but rather "one or more." Unless specifically stated otherwise, the term "some" refers to one or more. A phrase referring to "at least one of" a list of items refers to any combination of those items, including single members. As an example, "at least one of: a, b, or c" is intended to cover at least: a, b, c, a-b, a-c, b-c, and a-b-c, as well as any combination with multiples of the same element (e.g., a-a, a-a-b, a-a-c, a-b-b, a-c-c, b-b, b-b-b, b-b-c, c-c, and c-c-c or any other ordering of a, h, and c). All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112(f) unless the element is expressly recited using the phrase "means for" or, in the case of a method claim, the element is recited using the phrase "step for."

What is claimed is:

1. A memory cell, comprising:
a first semiconductor region;
a second semiconductor region;
a third semiconductor region, the second semiconductor region being disposed between the first semiconductor region and the third semiconductor region;
a front gate region disposed above the second semiconductor region;
a floating back gate region, a first portion of the floating back gate region being disposed below the second semiconductor region; and
a non-insulative region disposed adjacent to the floating back gate region and coupled to a word line of the memory cell.

2. The memory cell of claim 1, wherein the non-insulative region is disposed above a second portion of the floating back gate region.

3. The memory cell of claim 1, further comprising:
a dielectric layer disposed between the front gate region and the second semiconductor region.

4. An apparatus comprising the memory cell of claim 1, the apparatus further comprising a memory controller configured to program the memory cell by:
applying a first voltage to the non-insulative region; and
applying a second voltage to the first semiconductor region, the third semiconductor region, and the front gate region.

5. The memory cell of claim 1, further comprising:
a floating non-insulative region disposed above the non-insulative region, the floating non-insulative region being shorted to the floating back gate region.

6. The memory cell of claim 5, further comprising:
a dielectric layer disposed between the non-insulative region and the floating non-insulative region.

7. The memory cell of claim 1, wherein the non-insulative region comprises a floating semiconductor region shorted to the floating back gate region, the memory cell further comprising:
another non-insulative region disposed above the floating semiconductor region.

8. The memory cell of claim 7, further comprising a dielectric layer disposed between the other non-insulative region and the floating semiconductor region.

9. An apparatus comprising the memory cell of claim 7, the apparatus further comprising a memory controller configured to program the memory cell by:
applying a first voltage to the other non-insulative region; and
applying a second voltage to the first semiconductor region, the third semiconductor region, and the front gate region.

10. A method for programming a memory cell, comprising:
determining a logic state to be stored in the memory cell;
generating a voltage signal based on the determination of the logic state to be stored in the memory cell; and
applying the voltage signal to a non-insulative region of the memory cell to transfer charge to a floating back gate region of the memory cell, wherein the non-insulative region is disposed adjacent to the floating back gate region and coupled to a word line of the memory cell.

11. The method of claim 10, wherein the non-insulative region is above at least a portion of the floating back gate region.

12. The method of claim 10, wherein the memory cell comprises a field-effect transistor (FET), and wherein the FET comprises a front gate region, the floating back gate region and the front gate region being disposed adjacent to opposite sides of a semiconductor region of the FET.

13. The method of claim 10, wherein the charge is transferred to the floating back gate region via a floating non-insulative region shorted to the floating back gate region, the floating non-insulative region being disposed above the non-insulative region.

14. The method of claim 10, wherein the charge is transferred to the floating back gate region via a floating semiconductor region shorted to the floating back gate region, the non-insulative region being disposed above the floating semiconductor region.

15. A method for fabricating a memory cell, comprising:
forming a first semiconductor region, a second semiconductor region, and a third semiconductor region, the second semiconductor region being between the first semiconductor region and the third semiconductor region;
forming a front gate region above the second semiconductor region;
forming a floating back gate region, a first portion of the floating back gate region being below the second semiconductor region; and
forming a non-insulative region adjacent to the floating back gate region, the non-insulative region being coupled to a word line of the memory cell.

16. The method of claim 15, wherein the non-insulative region is formed above a second portion of the floating back gate region.

17. The method of claim 15, further comprising:
forming a dielectric layer between the front gate region and the second semiconductor region.

18. The method of claim 15, further comprising:
forming a floating non-insulative region above the non-insulative region, the floating non-insulative region being shorted to the floating back gate region.

19. The method of claim 18, further comprising:
forming a dielectric layer between the non-insulative region and the floating non-insulative region.

20. The method of claim 15, wherein the non-insulative region comprises a floating semiconductor region, the method further comprising:
shorting the floating back gate region to the floating semiconductor region; and
forming another non-insulative region above the floating semiconductor region.

* * * * *